United States Patent
Del Gatto et al.

(10) Patent No.: US 7,324,379 B2
(45) Date of Patent: Jan. 29, 2008

(54) MEMORY DEVICE AND METHOD OF OPERATING THE SAME WITH HIGH REJECTION OF THE NOISE ON THE HIGH-VOLTAGE SUPPLY LINE

(75) Inventors: Nicola Del Gatto, Torre del Greco (IT); Massimiliano Mollichelli, Campobasso (IT); Massimiliano Scotti, Cernusco Sul Naviglio (IT); Marco Sforzin, Cantù (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 115 days.

(21) Appl. No.: 11/241,729

(22) Filed: Sep. 30, 2005

(65) Prior Publication Data

US 2006/0171204 A1  Aug. 3, 2006

(30) Foreign Application Priority Data

Oct. 8, 2004  (EP) .................................. 04425754

(51) Int. Cl.
*G11C 16/04*  (2006.01)
*G11C 16/06*  (2006.01)

(52) U.S. Cl. .............................. 365/185.18; 365/185.23

(58) Field of Classification Search ................ 365/206, 365/185.23, 226, 185.18, 185.19, 185.03
See application file for complete search history.

(56) References Cited

U.S. PATENT DOCUMENTS

| 4,733,377 | A | | 3/1988 | Aoyama et al. |
| 5,347,486 | A | | 9/1994 | Urai |
| 5,638,320 | A | * | 6/1997 | Wong et al. ............ 365/185.03 |
| 6,101,118 | A | * | 8/2000 | Mulatti et al. ............... 365/149 |
| 6,606,267 | B2 | * | 8/2003 | Wong ..................... 365/185.22 |
| 2003/0048689 | A1 | | 3/2003 | Kim |

OTHER PUBLICATIONS

European Search Report, EP 04 42 5754, dated Feb. 24, 2005.

* cited by examiner

*Primary Examiner*—Richard T. Elms
*Assistant Examiner*—Douglas King
(74) *Attorney, Agent, or Firm*—Gardere Wynne Sewell LLP

(57) ABSTRACT

A memory device has an array of memory cells. A column decoder is configured to address the memory cells. A charge-pump supply circuit generates a boosted supply voltage for the column decoder. A connecting stage is arranged between the supply circuit and the column decoder. The connecting stage switches between a high-impedance state and a low-impedance state, and is configured to switch into the high-impedance state in given operating conditions of the memory device, in particular during a reading step.

27 Claims, 3 Drawing Sheets

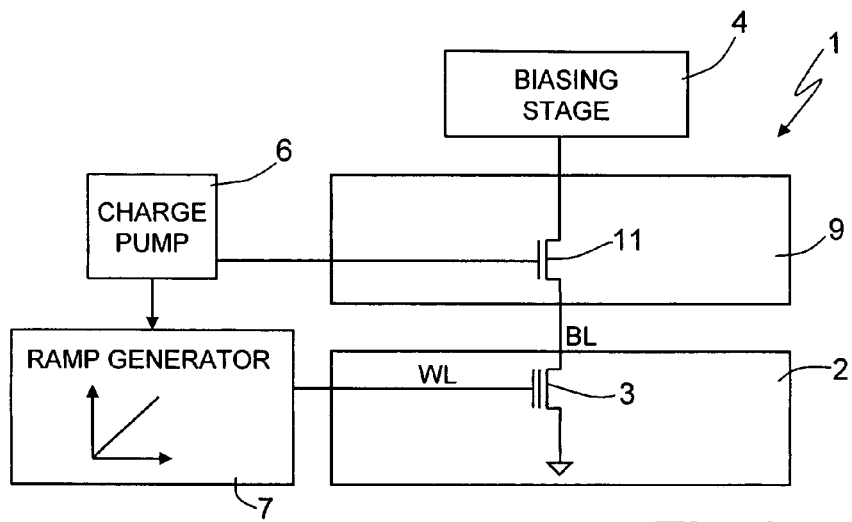
Fig.1
*(Prior Art)*
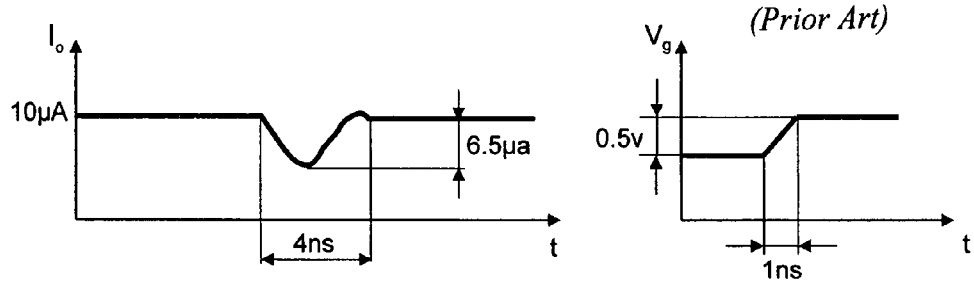
Fig.2a
*(Prior Art)*
Fig.2b
*(Prior Art)*
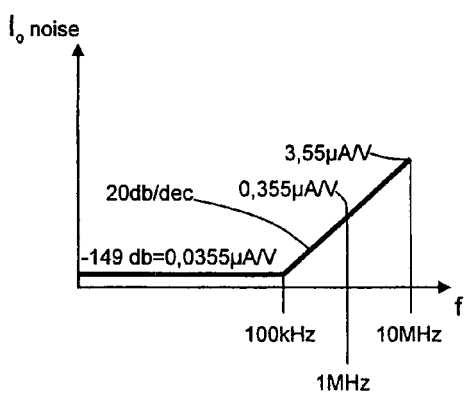
Fig.3
*(Prior Art)*
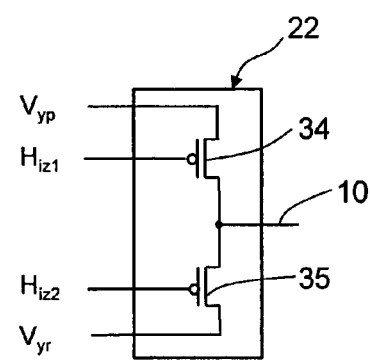
Fig.6

MEMORY DEVICE AND METHOD OF OPERATING THE SAME WITH HIGH REJECTION OF THE NOISE ON THE HIGH-VOLTAGE SUPPLY LINE

PRIORITY CLAIM

The present application claims priority from European Patent Application No. 04425754.1 filed Oct. 8, 2004, the disclosure of which is hereby incorporated by reference.

BACKGROUND OF THE INVENTION

1. Technical Field of the Invention

The present invention relates to a memory device and to a method for operating the same with high rejection of the noise on the high-voltage supply line. This high-voltage supply line may comprise the supply line connected at the output of a voltage-booster circuit generating a boosted voltage for the memory device. In particular, the present invention concerns, without limitation, a nonvolatile multi-level flash memory device with gate-ramp reading.

2. Description of Related Art

As is known, in multilevel flash memories, the data to be stored are encoded using a number of logic levels, each associated to a different threshold voltage of the memory cells.

During the reading step of the multilevel flash memory, a ramp voltage (either continuous or stepwise) is supplied to the gate terminals of the addressed memory cells. The ramp voltage increases between a minimum value and a maximum value. The current flowing in the memory cell is then converted into a voltage, which is supplied to a comparator circuit that compares it with reference values. The datum stored in the cell can be determined on the basis of the voltage that is supplied to the gate terminal of the memory cell and on the basis of the comparator output.

It is also known that memory cells are organized within a memory array and that memory devices are provided with appropriate decoder circuits for decoding the row and column addresses, which enable selection in reading or in modification (programming or erasure) of a particular memory cell belonging to the memory array.

For greater clarity, reference is made to FIG. 1, which illustrates an extremely simplified diagram of a memory device 1 comprising a memory array 2 formed by a plurality of memory cells 3 (of which only one is shown). The memory cell 3 has a gate terminal connected to a wordline WL and a drain terminal connected to a bitline BL. In a manner well known to those skilled in the art, the bitline BL is connected to a column decoder 9 and the wordline WL is connected (through a row decoder not shown) to a ramp generator 7; moreover, the column decoder 9 is connected to a biasing stage 4. A supply circuit 6 is connected to the column decoder 9 and to the ramp generator 7. The supply circuit 6 is generally constituted by a charge pump, is connected at its input to a low-voltage supply line (not shown) of the memory device 1 (having a voltage, for example, of 3 V), and outputs a boosted voltage, for operation of the memory device 1.

In particular, the column decoder 9 comprises a plurality of selection transistors 11 (of which only one is shown), implemented by NMOS or PMOS transistors (known as "pass transistors"), the number of which is linked to the organization and size of the memory array 2, or of the partitions into which the memory array 2 is divided. In detail, the selection transistors 11, when enabled, connect the drain terminal of each memory cell 3 to the biasing stage 4 so as to supply reading or programming biasing voltages, according to the operating step of the memory device 1.

During reading, the ramp generator 7 supplies, on the gate terminal of the memory cell 3, a read ramp voltage, e.g., up to a maximum of 6 V, and the biasing stage 4 supplies, on the drain terminal of the memory cell 3, and through the column decoder 9, a constant voltage, for example of approximately 0.7 V. In particular, for said voltage to be present on the drain terminal of the memory cell 3, the corresponding selection transistors 11 must be driven into conduction with a boosted gate voltage typically around 5 V or 6 V.

As is known, a ripple is usually present on the boosted voltage at the output of the supply circuit 6, which constitutes a noise. While the ramp generator 7 has a high rejection of the noise on the input supply voltage, the ripple on the output of the supply circuit 6 is transferred directly onto the gate terminal of the selection transistors 11. Said noise, on account of the capacitive coupling between the gate terminal and the source and drain terminals of the selection transistor 11, generates a similar noise on the current flowing in the memory cell 3.

Since reading of the memory cell 3 is based, as described, upon the value of the current flowing in the memory cell 3, the noise on the output of the supply circuit 6 can generate reading errors of the data stored in the memory cell 3.

FIG. 2a shows the plot of the current $I_o$ flowing in the memory cell 3 during the reading step, and in the presence of a noise on the output of the supply circuit 6, causing a variation of the voltage $V_g$ supplied to the gate terminal of the selection transistor 11 (see FIG. 2b). In particular, it may be noted that a 0.5 V increase of the voltage $V_g$ on the gate terminal of the selection transistor 11 in a time interval of 1 ns causes a transient of 4 ns, wherein the current $I_o$ undergoes a peak decrease of 6.5 µA. FIG. 3 shows the frequency domain plot of the noise on the current $I_o$. It is clear that said current variation can effectively cause an error in reading of the datum stored in the memory cell 3.

A need accordingly exists to overcome the shortcomings of the prior art, and in particular to provide a memory with high rejection of the noise on the high-voltage supply line, thus enabling a reduction of the reading errors caused thereby.

SUMMARY OF THE INVENTION

In accordance with an embodiment of the invention, a memory device comprises an array of memory cells, a column decoder configured to address said memory cells and a column-supply circuit generating a supply voltage for said column decoder. A connecting stage is arranged between said column-supply circuit and said column decoder. The connecting stage switches between a high-impedance state and a low-impedance state, and is configured to switch into said high-impedance state in given operating conditions of said memory device.

In accordance with another embodiment, a method is presented for operating a memory device. The memory device comprises an array of memory cells, a column decoder configured to address said memory cells, and a column-supply circuit generating a supply voltage for said column decoder. The method comprises performing, in sequence, the steps of selecting in reading at least one of said memory cells and reading data stored in said memory cell. Selecting comprises connecting said column decoder to said column-supply circuit, and reading comprises disconnecting said column decoder from said column-supply circuit.

In accordance with another embodiment, a circuit comprises a memory cell including a bit line, a column decoder coupled to the bit line and having a supply voltage input, and a boosted voltage supply line. A circuit interconnects the boosted voltage supply line to the supply voltage input of the column decoder in response to a control signal such that when the control signal is in a first state the boosted voltage supply line is connected to the supply voltage input and when the control signal is in a second state the boosted voltage supply line is disconnected and the supply voltage input of the column decoder is left floating.

In another embodiment, a circuit comprises a memory cell including a bit line, a column decoder coupled to the bit line and having a supply voltage input, a boosted programming voltage supply line and a boosted read voltage supply line. A circuit interconnects the boosted programming and read voltage supply lines to the supply voltage input of the column decoder in response to first and second control signals such that when the first control signal is in a first state the boosted programming voltage supply line is connected to the supply voltage input, when the second control signal is in a first state the boosted read voltage supply line is connected to the supply voltage input and when the first and second control signals are each in a second state the boosted programming and read voltage supply lines are disconnected and the supply voltage input of the column decoder is left floating.

BRIEF DESCRIPTION OF THE DRAWINGS

A more complete understanding of the method and apparatus of the present invention may be acquired by reference to the following Detailed Description when taken in conjunction with the accompanying Drawings wherein:

FIG. 1 shows a simplified diagram of the architecture of a known type memory device;

FIGS. 2a, 2b show graphs relating to circuit quantities in the memory device of FIG. 1 in the presence of a noise on the high-voltage supply line;

FIG. 3 shows a graph of the frequency variation of a noise on the current flowing in a memory cell;

FIG. 6 shows a detail of a connecting stage of the memory device of FIG. 5.

DETAILED DESCRIPTION

Figure 4:
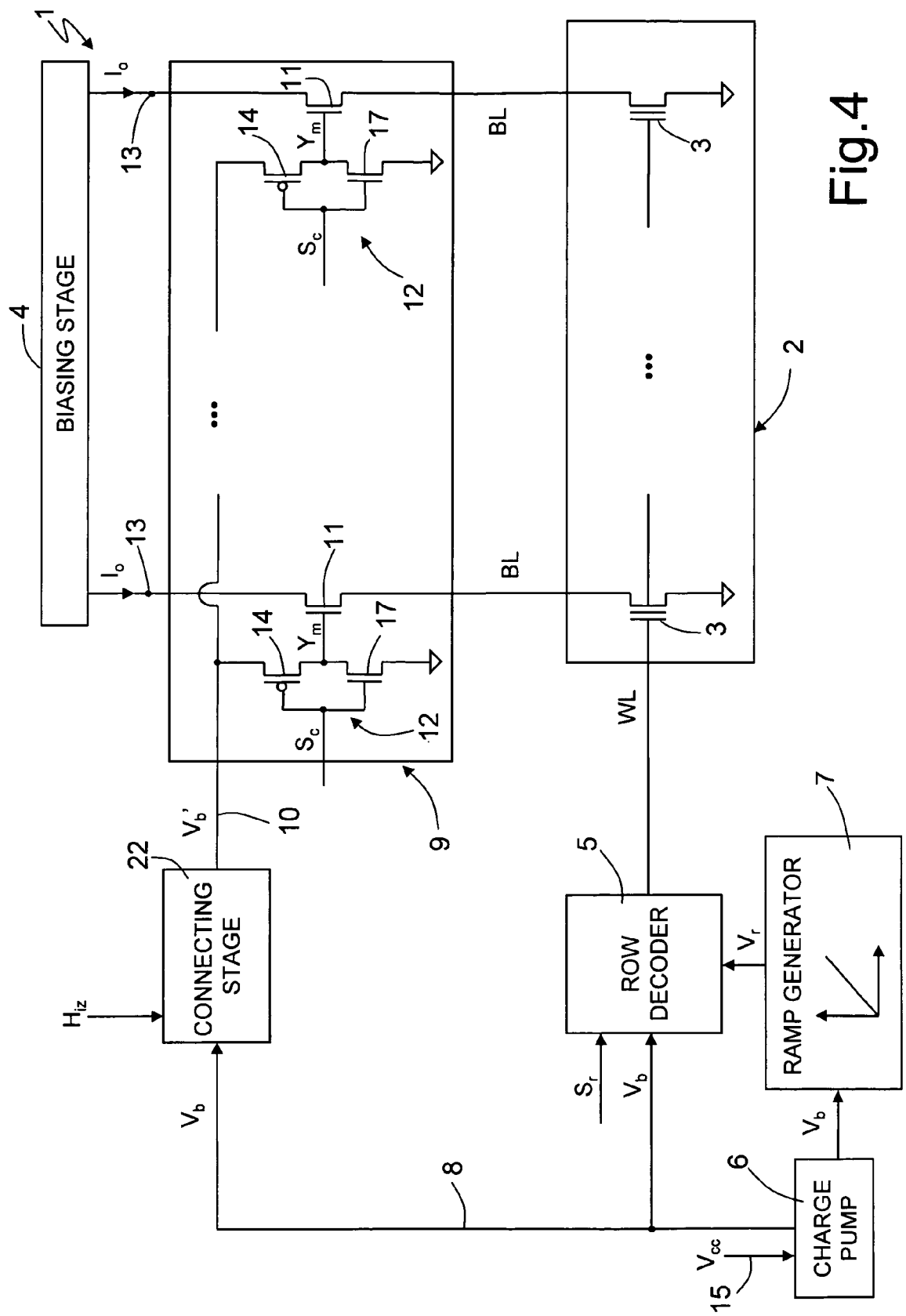
FIG. 4 shows the architecture of a multilevel flash memory device, according to a first embodiment of the present invention.

FIG. 4 shows the architecture of a multilevel flash memory device with gate-ramp reading according to a first embodiment of the present invention, and designated as a whole by reference number 1.

In detail, the memory device 1 comprises a memory array 2 constituted by a plurality of memory cells 3 of a flash type, organized in rows and columns. The memory cells 3 are addressed through wordlines WL and bitlines BL, which are connected, respectively, to the gate terminals and to the drain terminals of the memory cells 3. The memory array 2 could also constitute a sector of a memory array of larger dimensions.

The memory device 1 further comprises a row decoder 5 and a column decoder 9, which are configured to select and to bias, respectively, the wordlines WL and the bitlines BL on the basis of selection signals received at input.

In greater detail, the row decoder 5 has a first input connected to a supply circuit 6, a second input connected to a ramp-generator circuit 7, and outputs connected to the wordlines WL. Furthermore, the row decoder 5 receives row-selection signals $S_r$.

The supply circuit 6, which is of the charge-pump type, is connected at input to a low-voltage supply line 15 of the memory device 1 (having a voltage Vcc, for example, of 3 V), and has an output connected to a first high-voltage supply line 8, having a boosted supply voltage $V_b$.

The ramp-generator circuit 7 receives the boosted supply voltage $V_b$ from the supply circuit 6 and supplies a ramp voltage $V_r$ to the row decoder 5. During the reading step of the memory device 1, the ramp voltage $V_r$ is supplied to the gate terminal of the memory cells 3, selected on the basis of the row-selection signals $S_r$.

The column decoder 9 has an input connected to a second high-voltage supply line 10, and receives column-selection signals $S_c$. The column decoder 9 further comprises a set of selection switches, in particular formed by selection transistors 11 of an NMOS type. For clarity of representation, just one selection transistor 11 for each bitline BL is shown in FIG. 4, but the number of selection transistors is usually greater (typically there are three selection transistors for each column), according to the organization and size of the memory array 2 or its partition.

The selection transistors 11 are connected between respective biasing nodes 13 and a respective bitline BL, and receive at their own gate terminals control signals $Y_m$, $Y_n$, $Y_o$ (of which only the signal $Y_m$ is shown in FIG. 4, to which reference will be made in the following; the corresponding discussion is in any case applicable also to the other signals $Y_n$, $Y_o$), so as to select and bias only some of the bitlines BL at each read operation (in number equal to the memory cells 3 that are to be read at the same time).

The control signals $Y_m$ are provided at output by a respective inverter 12 of a CMOS type.

In detail, each inverter 12 has an output supplying the control signal $Y_m$, a first input receiving one of the column-selection signals $S_c$, and a second input connected to the second supply line 10. The inverter 12 comprises a first transistor 14, of a PMOS type, and a second transistor 17, of an NMOS type. The first transistor 14 has its drain terminal connected to the second supply line 10 and its source terminal connected to the output of the inverter 12. In turn, the second transistor 17 has its drain terminal connected to the output of the inverter 12 and its source terminal connected to ground. The gate terminals of the first and second transistors 14, 17 are moreover connected together and receive the column-selection signal $S_c$. In particular, the column-selection signal $S_c$ is a two-level signal that can assume the value of the boosted supply voltage $V_b$ (high level) and that of ground (low level).

When a memory cell 3 is to be selected and thus the respective selection transistor 11 is to be driven into conduction, the column-selection signal $S_c$ assumes a low value so that the output of the respective inverter 12 and thus the respective control signal $Y_m$ assume a high value and enable biasing of the memory cell 3. Otherwise, the column-selection signal $S_c$ assumes a high value so that the control signal $Y_m$ assumes a low value, and the respective selection transistor 11 is turned off. In particular, during the reading step the control signals $Y_m$ of the selected memory cells 3 assume a value of around 5 V or 6 V.

The memory device 1 further comprises a programming/reading-biasing stage 4.

In a manner known to those skilled in the art, the programming/reading-biasing stage 4 supplies a programming voltage or a read voltage to the column decoder 9, according to the operation that must be performed on the memory cells 3, each time these are addressed and selected. In particular, during the reading step, the biasing voltage applied on the drain terminal of the selected memory cells 3 is approximately 1 V (typically 0.7 V).

According to one aspect of the present invention, the memory device 1 further comprises a connecting stage 22 arranged between the supply circuit 6 and the column decoder 9, and in particular between the first and second supply lines 8, 10.

The connecting stage 22 receives at input the boosted supply voltage $V_b$ generated by the supply circuit 6, and a impedance-control signal $H_{iz}$. The impedance-control signal $H_{iz}$ is a two-level signal that can assume the value of the boosted supply voltage $V_b$ (high value) and that of ground (low value). The connecting stage 22 (which may, for example as shown in FIG. 6, be provided via a switch or transistor controlled by the impedance-control signal $H_{iz}$) outputs, on the second supply line 10, a stabilized voltage $V_b'$ supplying the inverter 12. The connecting stage 22 switches between a low-impedance state and a high-impedance state according to the level of the impedance-control signal $H_{iz}$.

In greater detail, when the impedance-control signal $H_{iz}$ assumes the first level (for example, a low value), the connecting stage 22 assumes the low impedance state, the first supply line 8 is thus connected to the second supply line 10, and the stabilized voltage $V_b'$ is equal to the boosted supply voltage $V_b$. When, instead, the impedance-control signal $H_{iz}$ assumes the second level (in the example, a high value), the connecting stage 22 assumes the high impedance state, and the second supply line 10 is thus disconnected from the first supply line 8 and remains floating. Consequently, in this case, the second supply line 10 sees a high impedance, and the stabilized voltage $V_b'$ remains practically constant at the previous value. In the design stage it is important to pay particular attention to the layout of the second supply line 10 so as to avoid the presence of interfering lines in the immediate vicinity. With an accurate layout, the capacitance on the second supply line 10, which is approximately of 40 pF, is sufficient to keep the value of the stabilized voltage $V_b'$ practically constant when the second supply line 10 remains floating.

In particular, during the step of addressing the memory cells 3, which precedes the reading step, the connecting stage 22 outputs the boosted supply voltage $V_b$ so that the memory cells 3 can be addressed and biased in a traditional manner on the basis of the column-selection signals $S_c$. During the subsequent reading step, i.e., when it is desirable that the voltage on the gate terminals of the selection transistors 11 remains constant to prevent reading errors, the connecting stage 22 is driven into the high-impedance state. In this way, the gate terminals of the selection transistors 11 remain floating, and their voltages remain practically constant at the boosted value, supplied in the preceding addressing step. Consequently, the current $I_o$ flowing in the selection transistor 11 does not undergo amplitude variations on account of the noise on the first supply line 8.

The gate terminals of the selection transistors 11 of the addressed memory cells 3 must be kept in the floating condition throughout the step of evaluation of the data stored in the memory cells 3, and in particular throughout the ramp of the ramp voltage $V_r$. During the subsequent addressing step, the gate terminals are again connected to the first supply line 8. A difference in the absolute value of the gate terminal voltage between one reading step and the next has in any case a negligible effect on the determination of the value of the current $I_o$ flowing in the memory cell 3.

According to a further aspect of the present invention (see FIG. 5), separation of the high-voltage supply lines towards the row decoder 5 and the column decoder 9 is proposed. In this way, it is possible to decouple the noise effects in the row and column decoding circuits, and to design the corresponding supply circuits in an independent way.

The architecture of the memory device, designated in FIG. 5 by 30, is substantially similar to the one described with reference to FIG. 4, so that parts that are similar will be designated with the same reference numbers.

Figure 5:
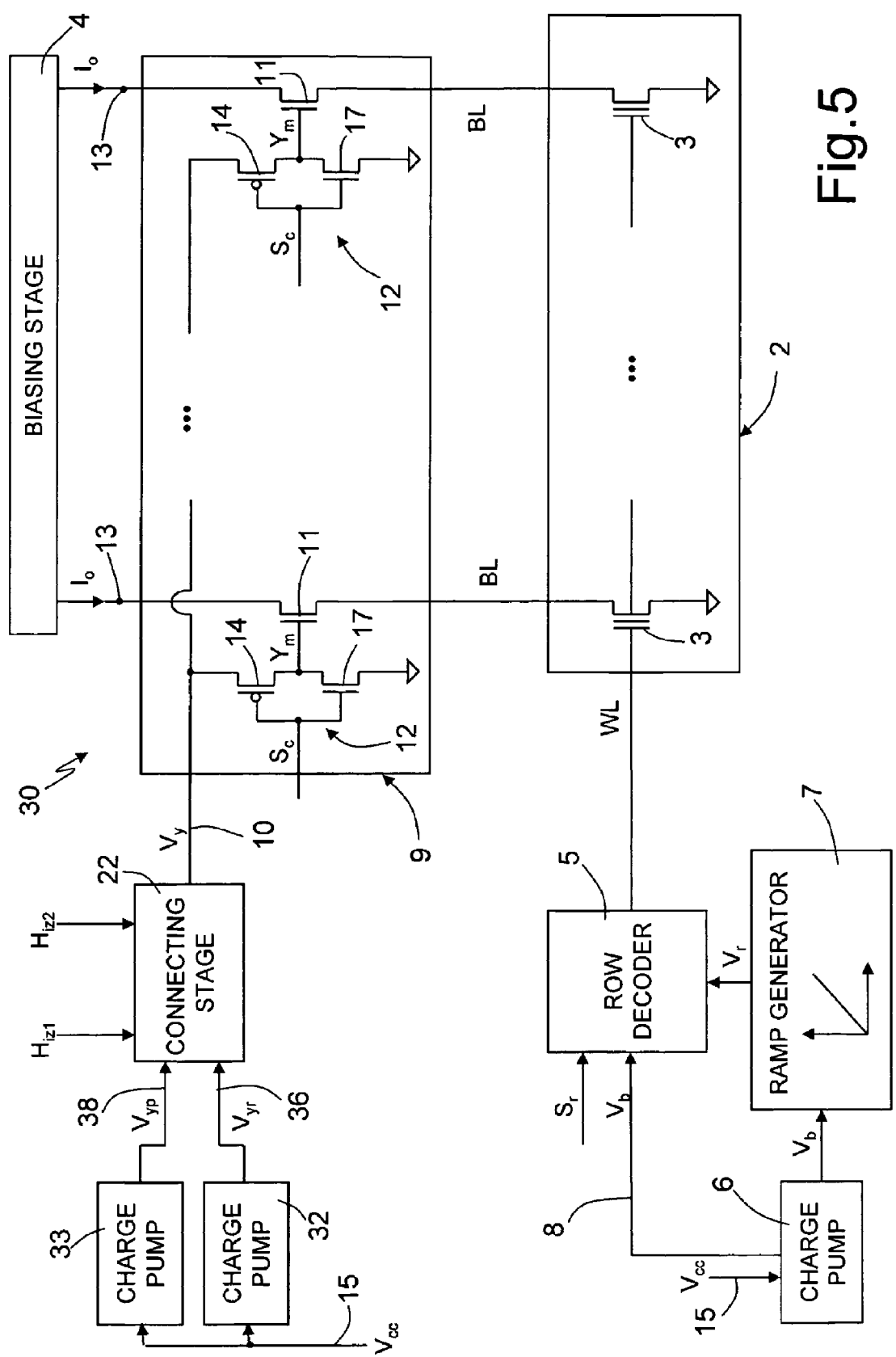
FIG. 5 shows the architecture of a second embodiment of the multilevel flash memory device.

The memory device 30 according to FIG. 5 comprises a second supply circuit 32 of the charge-pump type, having an output connected to a high-voltage reading supply line 36, providing a reading supply voltage $V_{yr}$ (generally of around 5 V or 6 V, as previously described), for supplying the column decoder 9 during the reading step.

The memory device 30 further comprises a third supply circuit 33, which is also of the charge-pump type, and has an output connected to a high-voltage programming supply line 38, providing a programming supply voltage $V_{yp}$ (higher than or equal to the reading supply voltage $V_{yr}$ and with a value of around 8 V), for supplying the column decoder 9 during the programming step. During the programming step of the memory cells 3, it is in fact necessary to drive the respective selection transistors 11 into a condition of marked conduction.

In this case, the connecting stage 22 is connected at input to the reading and programming supply lines 36, 38 to receive, respectively, the reading supply voltage $V_{yr}$ and the programming supply voltage $V_{yp}$, and moreover receives a first impedance-control signal $H_{iz1}$ and a second impedance-control signal $H_{iz2}$. In particular, the first and the second impedance-control signals $H_{iz1}$ and $H_{iz2}$ are two-level signals, which can assume the value of the programming supply voltage $V_{yp}$ (high value) and that of ground (low value).

According to the value of the first and second impedance-control signals $H_{iz1}$ and $H_{iz2}$, the connecting stage 22 is driven into a high-impedance state, in which it disconnects the second supply line 10 from the reading and programming supply lines 36, 38, or else into a low-impedance state, in which it connects the second supply line 10 to the reading supply line 36 or to the programming supply line 38, according to the operating step of the memory device 30.

In detail (see FIG. 6), the connecting stage 22, in one of its possible embodiments, comprises a read transistor 34, of a PMOS type, and a programming transistor 35, which is also of a PMOS type. The read transistor 34 has its source terminal receiving the programming supply voltage $V_{yp}$, its gate terminal receiving the first impedance-control signal $H_{iz1}$, and its drain terminal connected to the drain terminal of the programming transistor 35 and to the output of the connecting stage 22. The programming transistor 35 has its source terminal receiving the reading supply voltage $V_{yr}$, and its gate terminal receiving the second impedance-control signal $H_{iz2}$.

During the step of addressing and selection of the memory cells 3, which precedes the reading step, the second impedance-control signal $H_{iz2}$ has a low value, and the first impedance-control signal $H_{iz1}$ has a high value so that the connecting stage 22 outputs the reading supply voltage $V_{yr}$. During the reading step, instead, when it is necessary to keep the voltage on the gate terminal of the selection transistors 11 constant, both the second impedance-control signal $H_{iz2}$ and the first impedance-control signal $H_{iz1}$ have a high value so that the output of the connecting stage 22 is in a high-impedance condition. In this step then, the voltage on the gate terminal of the selection transistors 11 remains practically constant and is not influenced by the noise on the reading supply line 36, generated by the corresponding charge pump.

Likewise, during the programming step, the first impedance-control signal $H_{iz1}$ has a low value, and the second impedance-control signal $H_{iz2}$ has a high value so that the connecting stage 22 outputs the programming supply voltage $V_{yp}$.

The present invention enables the following advantages to be obtained.

In the first place, the connecting stage 22 enables elimination of the reading errors caused by the noise on the supply line.

Furthermore, the separation of the supply lines for the column and row decoders enables designing of the respective charge pumps in an optimized way for the generation of the respective regulated voltages (which have different values). In particular, it can be shown that in this way both the consumption and the occupied area of silicon are optimized as compared to the case where a single charge pump supplies the row decoder and the column decoder during the reading step.

In particular, the charge pump supplying the column decoder has a very small load as compared to the one supplying the row decoder, in so far as the column parasitic capacitances are by some orders of magnitude smaller than the row parasitic capacitances. The smaller load leads to an increase in the ripple on the boosted supply voltage supplying the column decoder, and consequently to a greater occurrence probability of reading errors. In this case, the use of the connecting stage according to the present invention, arranged between the charge pump associated to the column decoder and the column decoder, is thus even more advantageous.

Finally, it is evident that modifications and variations can be made to what described and illustrated herein, without thereby departing from the scope of the present invention, as defined in the appended claims.

In particular, it is evident that the connecting stage can be provided with a wide range of other circuit structures different from the one described.

It is moreover clear that the present invention is not limited to the application described herein since it can advantageously be applied to various types of memories other than multilevel flash memories with gate-ramp reading.

Although preferred embodiments of the device of the present invention have been illustrated in the accompanying Drawings and described in the foregoing Detailed Description, it will be understood that the invention is not limited to the embodiments disclosed, but is capable of numerous rearrangements, modifications and substitutions without departing from the spirit of the invention as set forth and defined by the following claims.

What is claimed is:

1. A memory device, comprising:
    an array of memory cells;
    a column decoder configured to address said memory cells, said column decoder including at least one selection transistor with a control terminal;
    a column-supply circuit generating a supply voltage for said column decoder;
    a connecting stage arranged between said column-supply circuit and the control terminal of said column decoder, said connecting stage switching between a high-impedance state at the control terminal and a low-impedance state at the control terminal, and being configured to switch into said high-impedance state so as to leave the control terminal floating in given operating conditions of said memory device.

2. The memory device according to claim 1, wherein said column-supply circuit comprises a charge pump and has an input connected to a low-voltage supply line; and wherein said supply voltage is a boosted voltage.

3. The memory device according to claim 1, wherein said given operating conditions comprise a reading step.

4. The memory device according to claim 1, wherein said control terminal is the gate terminal of said selection transistor.

5. The memory device according to claim 4, wherein said column decoder further comprises an inverter circuit having an output connected to the gate terminal of said selection transistor, a first input receiving a column-selection signal, and a second input connected to said output of said connecting stage.

6. The memory device according to claim 1, wherein said connecting stage has a first input connected to said column-supply circuit and receiving said supply voltage, a second input receiving a first control signal, and an output supplying a stabilized voltage equal to said supply voltage when said connecting stage is in said low-impedance state; said first control signal controlling switching of said connecting stage between said high-impedance and low-impedance states.

7. The memory device according to claim 1, further comprising a row decoder connected to said column-supply circuit.

8. The memory device according to claim 1, further comprising a row decoder and a row-supply circuit, distinct from said column-supply circuit and connected to said row decoder.

9. The memory device according to claim 8, further comprising an additional supply circuit, which is connected to and supplies to said connecting stage a programming voltage, said supply voltage being a read voltage.

10. The memory device according to claim 9, wherein said connecting stage has a first control input receiving a first control signal, a second control input receiving a second control signal, a first supply input receiving said read voltage, and a second supply input receiving said programming voltage; said first and second control signals controlling switching of said connecting stage between said high-impedance and said low-impedance states.

11. The memory device according to claim 10, wherein said connecting stage comprises a first transistor, and a second transistor; said first transistor having a first conduction terminal connected to said second supply input and receiving said programming voltage, a gate terminal connected to said first control input and receiving said first control signal, and a drain terminal connected to said output of said connecting stage, and said second transistor having a drain terminal connected to said output of said connecting stage, a source terminal connected to said first supply input and receiving said second supply voltage, and a gate terminal connected to said second control input and receiving said second control signal.

12. The memory device according to claim 1, wherein said memory cells are of a multilevel flash type, and wherein said memory device further comprises a ramp-generator circuit supplying a ramp voltage to said row decoder.

13. A method for operating a memory device comprising an array of memory cells and a column decoder with a selection transistor configured to address said memory cells, and a column voltage supply circuit generating a supply voltage for application to a control terminal of the selection transistor of said column decoder; said method comprising, in sequence, the steps of:
   selecting in reading at least one of said memory cells; and reading data stored in said memory cell;
   wherein selecting comprises connecting the selection transistor control terminal of said column decoder to said column voltage supply circuit, and
   wherein reading comprises disconnecting the selection transistor control terminal of said column decoder from said column voltage supply circuit.

14. The method according to claim 13, wherein said memory device further comprises a connecting stage, arranged between said column voltage supply circuit and the selection transistor control terminal of said column decoder, and wherein connecting comprises controlling said connecting stage in a low-impedance state, and wherein disconnecting comprises controlling said connecting stage in a high-impedance state.

15. The method according to claim 14, wherein said connecting stage comprises a first transistor having a first terminal receiving a programming voltage and a second terminal connected to said column decoder, and a second transistor having a first terminal receiving said supply voltage and a second terminal connected to said column decoder, wherein selecting comprises turning off said first transistor and turning on said second transistor so as to connect said first terminal of said second transistor to said column decoder; and wherein reading comprising turning off both of said first and second transistors; the method further comprising:
   programming said memory cell, wherein programming comprises turning off said second transistor and turning on said first transistor so as to connect said first terminal of said first transistor to said column decoder.

16. The method according to claim 13, wherein said memory device further comprises a row decoder; and wherein selecting and reading comprise supplying to said row decoder a row supply voltage distinct from said supply voltage.

17. The method according to claim 16, wherein selecting and reading further comprise supplying a ramp voltage to said row decoder.

18. A circuit, comprising:
   a memory cell including a bit line;
   a column decoder coupled to the bit line and having a selection transistor with a control terminal input;
   a boosted voltage supply line;
   a circuit interconnecting the boosted voltage supply line to the control terminal input of the column decoder selection transistor in response to a control signal such that when the control signal is in a first state the boosted voltage supply line is connected to the control terminal input and when the control signal is in a second state the boosted voltage supply line is disconnected and the control terminal input of the column decoder selection transistor is left floating.

19. The circuit of claim 18 wherein the column decoder comprises:
   a selection transistor having its source/drain path connected to the bit line;
   an inverter having an input which receives a column selection signal and an output connected to the gate of the selection transistor, the inverter powered by the supply voltage input of the column decoder.

20. The circuit of claim 19 wherein the inverter comprises a CMOS inverter including a p-channel transistor having a source/drain path connected to the supply voltage input of the column decoder and the gate of the selection transistor.

21. A circuit comprising:
   a memory cell including a bit line;
   a column decoder coupled to the bit line and having a supply voltage input;
   a boosted voltage supply line;
   a circuit interconnecting the boosted voltage supply line to the supply voltage input of the column decoder in response to a control signal such that when the control signal is in a first state the boosted voltage supply line is connected to the supply voltage input and when the control signal is in a second state the boosted voltage supply line is disconnected and the supply voltage input of the column decoder is left floating.
   wherein the control signal being in the first state corresponds in time to the performance of an addressing operation with respect to the memory cell and wherein the control signal being in the second state corresponds in time to the performance of a reading operation with respect to the memory cell such that reading of the memory cell occurs when the supply voltage input of the column decoder is left floating.

22. A circuit, comprising:
   a memory cell including a bit line;
   a column decoder coupled to the bit line and having a supply voltage input;
   a boosted programming voltage supply line;
   a boosted read voltage supply line;
   a circuit interconnecting the boosted programming and read voltage supply lines to the supply voltage input of the column decoder in response to first and second control signals such that when the first control signal is in a first state the boosted programming voltage supply line is connected to the supply voltage input, when the second control signal is in a first state the boosted read voltage supply line is connected to the supply voltage input and when the first and second control signals are each in a second state the boosted programming and read voltage supply lines are disconnected and the supply voltage input of the column decoder is left floating.

23. The circuit of claim 22 wherein the column decoder comprises:
   a selection transistor having its source/drain path connected to the bit line;
   an inverter having an input which receives a column selection signal and an output connected to the gate of the selection transistor, the inverter powered by the supply voltage input of the column decoder.

24. The circuit of claim 23 wherein the inverter comprises a CMOS inverter including a p-channel transistor having a source/drain path connected to the supply voltage input of the column decoder and the gate of the selection transistor.

25. The circuit of claim 22:
   wherein the first control signal being in the first state corresponds in time to the performance of a programming operation with respect to the memory cell,
   wherein second control signal being in the first state corresponds in time to the performance of an addressing operation with respect to the memory cell; and wherein the first and second control signals each being in the second state corresponds in time to the performance of a reading operation with respect to the memory cell such that reading of the memory cell occurs when the supply voltage input of the column decoder is left floating.

26. The circuit of claim 22 wherein the memory cell further includes a word line, the circuit further comprising:
   a row decoder coupled to the bit line and having a supply voltage input;
   a boosted voltage supply line connected to the supply voltage input of the row decoder; and
   a charge pump separate from any charge pump used for the boosted programming and read voltage supply lines connected to the boosted voltage supply line.

27. The circuit of claim 22 further comprising:
   a programming voltage charge pump connected to the boosted programming voltage supply line; and
   a read voltage charge pump connected to the boosted read voltage supply line.

* * * * *